(12) United States Patent
Shirguppi

(10) Patent No.: US 9,300,322 B2
(45) Date of Patent: Mar. 29, 2016

(54) ENCODING OF PLAIN ASCII DATA STREAMS

(71) Applicant: Oracle International Corporation, Redwood Shores, CA (US)

(72) Inventor: Sagar Shamrao Shirguppi, Bangalore (IN)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 14/309,901

(22) Filed: Jun. 20, 2014

(65) Prior Publication Data

US 2015/0372693 A1    Dec. 24, 2015

(51) Int. Cl.
*H03M 7/00*    (2006.01)
*H03M 7/30*    (2006.01)

(52) U.S. Cl.
CPC ..................................... *H03M 7/705* (2013.01)

(58) Field of Classification Search
CPC .... H03M 7/30; G06F 17/2755; G06F 17/276; G06F 17/2872; G06F 17/273; G06F 17/28; G06F 17/2863; G06F 17/289; G06F 3/0236; G06F 8/447; G06F 9/44521; G06F 17/2223; G06F 17/227; G06F 17/271
USPC ............................... 341/51, 62, 84, 85, 86, 90
See application file for complete search history.

(56) References Cited

U.S. PATENT DOCUMENTS

| | | | | |
|---|---|---|---|---|
| 5,682,158 A * | 10/1997 | Edberg et al. | ................. | 341/90 |
| 5,708,829 A * | 1/1998 | Kadashevich et al. | ........ | 715/236 |
| 5,793,381 A * | 8/1998 | Edberg et al. | ................. | 345/467 |
| 5,890,183 A * | 3/1999 | Fujimoto | ....................... | 715/236 |
| 5,999,949 A | 12/1999 | Crandall | | |
| 6,631,501 B1 * | 10/2003 | Jurion | ................... | G06F 17/214 345/171 |
| 7,802,184 B1 * | 9/2010 | Battilana | ....................... | 715/257 |

(Continued)

FOREIGN PATENT DOCUMENTS

| | | |
|---|---|---|
| AU | 6558798 A | 9/1998 |
| CN | 85101055 A | 1/1987 |

(Continued)

OTHER PUBLICATIONS

Tjalkens T. J , Willems, F.M.J, Abstract, Variable to fixed-length codes for Markov sources, Information Theory, IEEE Transactions on (vol. 33 , Issue: 2 ), ISSN :0018-9448, Date of Publication :Mar. 1987, pp. 246-257, Publisher:IEEE.

(Continued)

*Primary Examiner* — Linh Nguyen
(74) *Attorney, Agent, or Firm* — IPHorizons PLLC; Narendra Reddy Thappeta

(57) ABSTRACT

A pair of adjacent characters in a plain ASCII data stream is examined for a condition that the pair contains a consonant followed by one of a set of characters, or a vowel followed by one of the set of characters. The set of characters is selected only from vowels and the space character. If the condition is satisfied, the pair is encoded as a corresponding extended ASCII code. If the condition is not satisfied, the first character of the pair is emitted as a corresponding plain ASCII code, and a next pair is formed with the second character of the (previous) pair as the first character and a next character of the plain ASCII stream as the second character. The next pair as well as further pairs are examined for the condition and correspondingly processed. Compression of the plain ASCII data stream is thereby achieved.

20 Claims, 4 Drawing Sheets

(56) References Cited

U.S. PATENT DOCUMENTS

| | | | |
|---|---|---|---|
| 8,229,971 B2* | 7/2012 | Meretab | G06F 17/2765 707/711 |
| 8,438,005 B1 | 5/2013 | Gupta et al. | |
| 8,589,144 B2* | 11/2013 | Kurashina | G06F 17/2217 704/2 |
| 8,726,148 B1* | 5/2014 | Battilana | 715/234 |
| 8,843,815 B2* | 9/2014 | Yang | G06F 17/30722 715/200 |
| 8,902,170 B2* | 12/2014 | Pasquero | G06F 3/0236 345/169 |
| 9,009,026 B2* | 4/2015 | Tanaka | G06F 17/2223 704/9 |
| 2004/0193399 A1* | 9/2004 | Potter et al. | 704/4 |
| 2007/0212670 A1 | 9/2007 | Paech et al. | |

FOREIGN PATENT DOCUMENTS

| | | |
|---|---|---|
| CN | 1280329 A | 1/2001 |
| CN | 1334497 A | 2/2002 |
| EP | 0271619 A1 | 6/1988 |
| EP | 0271664 A2 | 6/1988 |
| EP | 2712089 A1 | 3/2014 |
| WO | 9840969 A2 | 9/1998 |

OTHER PUBLICATIONS

Statistical Distributions of English Text, http://www.data-compression.com/english.html#first, downloaded circa Mar. 23, 2015, pp. 1-2.

Tjalkens T. J, Willems, F.M.J, Variable to fixed-length codes for Markov sources, Information Theory, IEEE Transactions on (vol. 33, Issue: 2), ISSN :0018-9448, Date of Publication :Mar. 1987, pp. 246-257, Publisher:IEEE.

Nisheeth Joshi and Iti Mathur, Input Scheme for Hindi Using Phonetic Mapping, http://cogprints.org/9062/1/Phonetic_Mapping_Joshi_Mathur.pdf, date 2010, pp. 1-6.

Phonetic Encoding Module, http://nlp.lsi.upc.edu/freeling/doc/userman/html/node54.html, downloaded circa Jul. 7, 2014, pp. 1-3.

The International Search Report, PCT/US14/72465, dated Mar. 31, 2015, pp. 1-4, International Bureau.

Written Opinion of the International Searching Authority, PCT/US14/72465, dated Mar. 31, 2015, pp. 1-4, International Bureau.

* cited by examiner

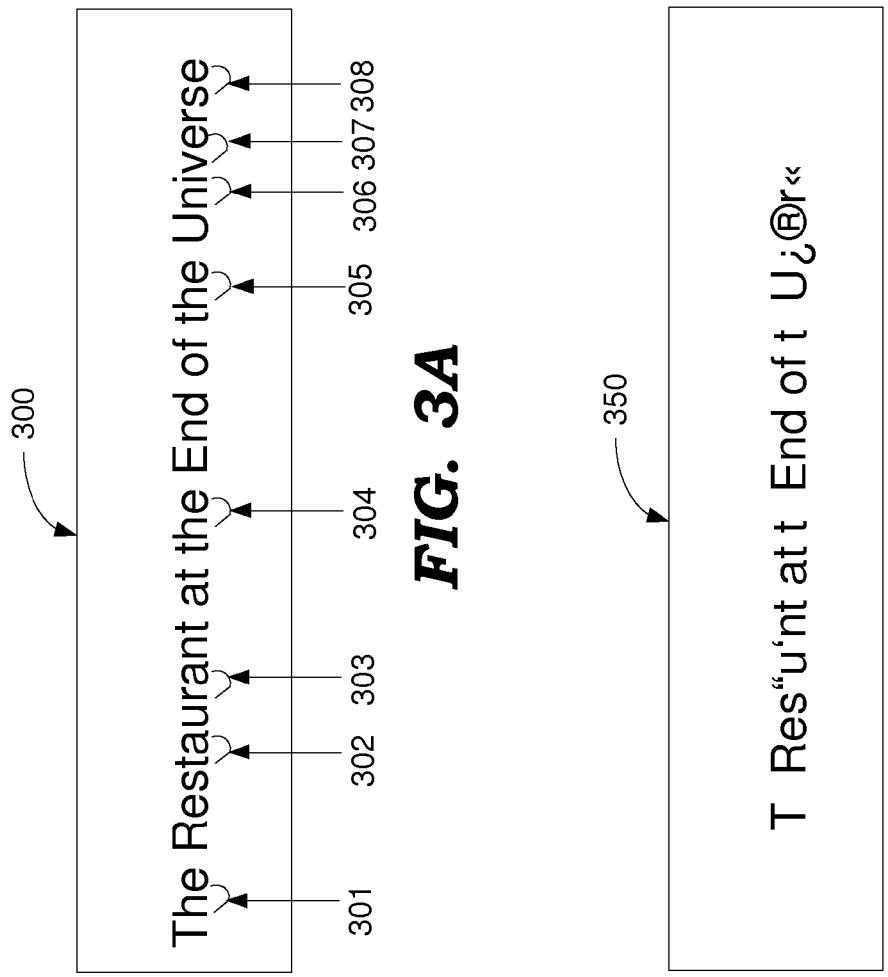

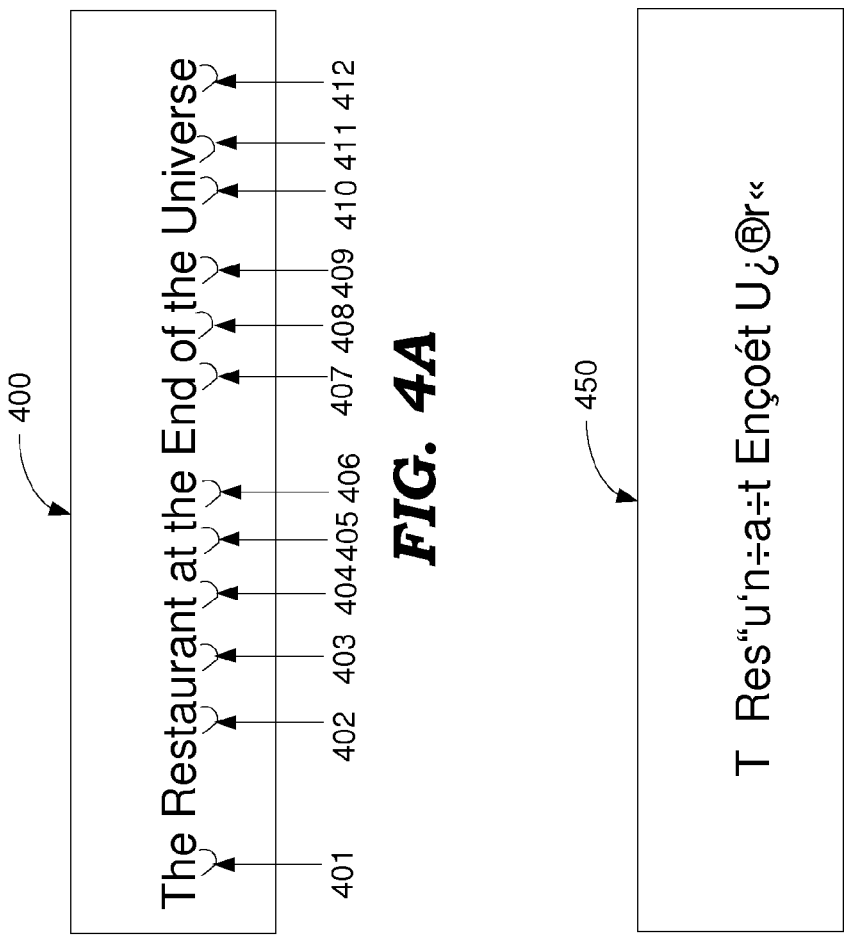

ENCODING OF PLAIN ASCII DATA STREAMS

BACKGROUND OF THE DISCLOSURE

1. Technical Field

The present disclosure relates generally to data encoding, and more specifically to encoding of plain ASCII (American Standard Code for Information Interchange) data streams.

2. Related Art

ASCII is a well known coding standard for representing various characters that commonly occur in written languages such as English. Plain ASCII uses 7-bit encoding to represent 128 specified characters—the numbers 0-9, the letters a-z and A-Z, some basic punctuation symbols, some control codes that originated with Teletype machines, and a blank space.

Plain ASCII is distinguished from extended ASCII, where the eighth bit (of a byte representation) is also used for encoding additional characters common in other languages such as Latin and its derivatives. If a byte is used to represent characters, plain ASCII characters would have a 0 in the most significant bit, while a 1 in that position is used to represent the extended ASCII.

A plain ASCII data stream is an ordered sequence of plain ASCII codes, with each code representing a corresponding character. In other words, the ordered sequence of characters is represented as a corresponding plain ASCII data stream, with each character having a corresponding position in the ordered sequence.

There may be a need to further encode such plain ASCII data streams, for example, to obtain better compression, etc. Aspects of the present disclosure provide for such encoding techniques, as described below.

BRIEF DESCRIPTION OF THE DRAWINGS

Example embodiments of the present disclosure will be described with reference to the accompanying drawings briefly described below.

FIG. 3A is a diagram of an example plain ASCII data file showing (source) contents prior to encoding, in an embodiment of the present disclosure.

FIG. 3B is a diagram of an output file showing the encoded contents, in an embodiment of the present disclosure.

FIG. 4A is a diagram of an example plain ASCII data file showing contents prior to encoding, in an alternative embodiment.

FIG. 4B is a diagram of an output file showing contents after encoding, in an alternative embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE EMBODIMENTS OF THE DISCLOSURE

1. Overview

According to an aspect of the present disclosure, a pair of adjacent characters in a plain ASCII data stream is examined for a condition that the pair contains a consonant followed by one of a set of characters, or a vowel followed by one of the set of characters. The set of characters is selected only from vowels and the space character. If the condition is satisfied, the pair is encoded as a corresponding extended ASCII code. If the condition is not satisfied, the first character of the pair is emitted as a corresponding plain ASCII code, and a next pair is formed with the second character of the (previous) pair as the first character and a next character of the plain ASCII stream as the second character. The next pair as well as further pairs are examined for the condition and correspondingly processed. Compression of the plain ASCII data stream is thereby achieved.

In an embodiment, the set of characters contains only five vowels. In another embodiment, the set of characters contains four vowels and the space character.

According to yet another aspect, a plain ASCII stream encoded using extended ASCII characters, is further compressed to generate a further compressed representation of the plain ASCII data stream.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Digital Processing System

Figure 1:
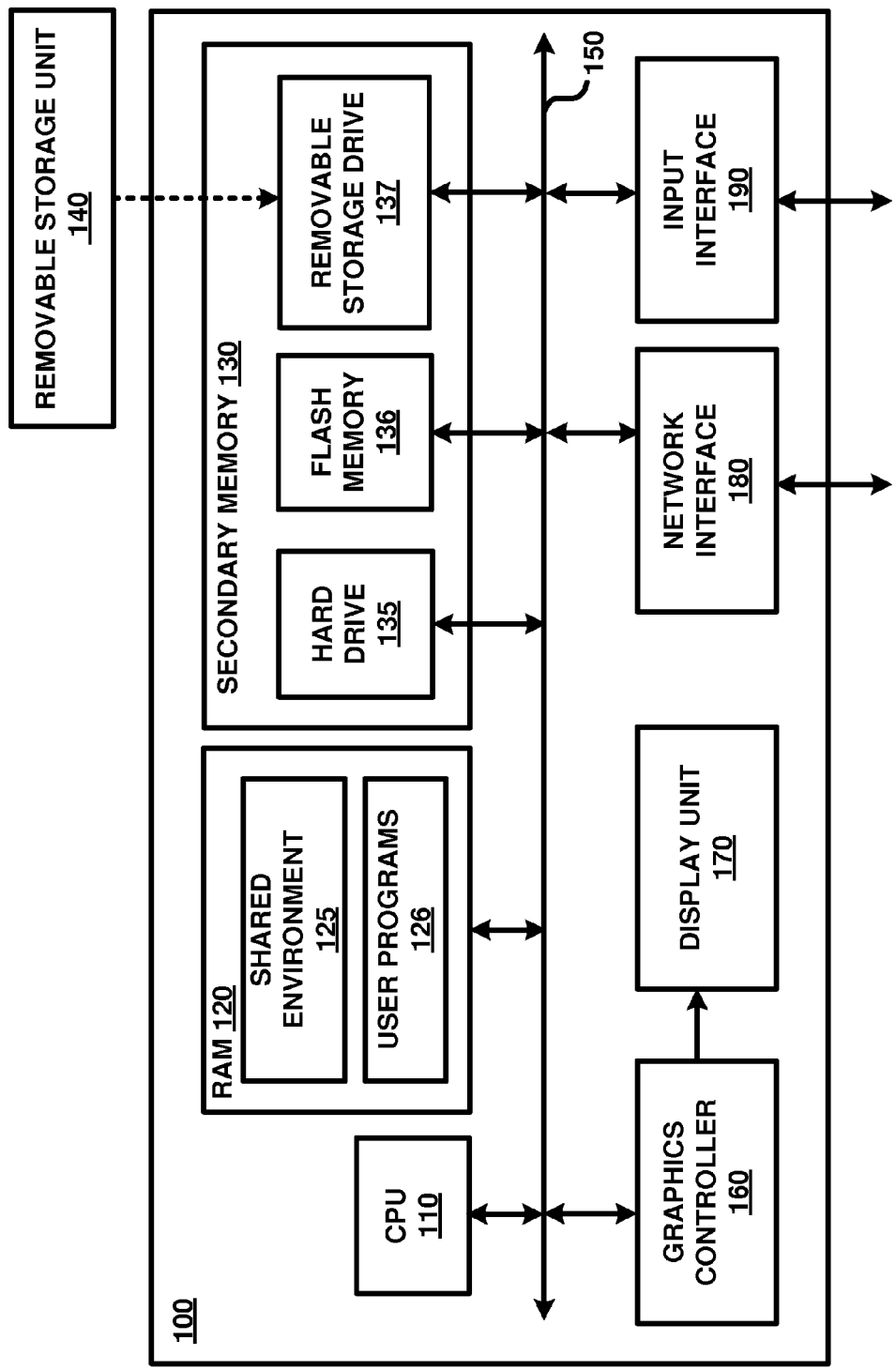
FIG. 1 is a block diagram illustrating the details of a digital processing system in which various aspects of the present disclosure are operative by execution of appropriate executable modules.

FIG. 1 is a block diagram illustrating the details of digital processing system 100 in which various aspects of the present disclosure are operative by execution of appropriate executable modules. Digital processing system 100 may contain one or more processors such as a central processing unit (CPU) 110, random access memory (RAM) 120, secondary memory 130, graphics controller 160, display unit 170, network interface 180, and input interface 190. All the components except display unit 170 may communicate with each other over communication path 150, which may contain several buses as is well known in the relevant arts. The blocks of FIG. 1 are described below in further detail.

CPU 110 may execute instructions stored in RAM 120 to provide several features of the present disclosure. CPU 110 may contain multiple processing units, with each processing unit potentially being designed for a specific task. Alternatively, CPU 110 may contain only a single general-purpose processing unit. RAM 120 may receive instructions from secondary memory 130 using communication path 150. RAM 120 is shown currently containing software instructions constituting shared environment 125 and user programs 126. Shared environment 125 includes operating systems, device drivers, virtual machines, etc., which provide a (common) run time environment for execution of user programs 126.

Graphics controller 160 generates display signals (e.g., in RGB format) to display unit 170 based on data/instructions received from CPU 110. Display unit 170 contains a display screen to display the images defined by the display signals. Input interface 190 may correspond to a keyboard and a pointing device (e.g., touch-pad, mouse) and may be used to provide inputs. Network interface 180 provides connectivity to a network and may be used to communicate with other systems connected to the network.

Secondary memory 130 may contain hard drive 135, flash memory 136, and removable storage drive 137. Secondary memory 130 may store the data (for example, an ASCII file sought to be encoded according to various aspects of the present disclosure) and software instructions (for implementing the steps of FIG. 2, described below), which enable digital processing system 100 to provide several features in accordance with the present disclosure. The code/instructions and ASCII data stored in secondary memory 130 may either be copied to RAM 120 prior to execution by CPU 110 for higher execution speeds, or may be directly executed by CPU 110.

Some or all of the data and instructions may be provided on removable storage unit 140, and the data and instructions may be read and provided by removable storage drive 137 to CPU 110. Removable storage unit 140 may be implemented using medium and storage format compatible with removable storage drive 137 such that removable storage drive 137 can read the data and instructions. Thus, removable storage unit 140 includes a computer readable (storage) medium having stored therein computer software and/or data. However, the computer (or machine, in general) readable medium can be in other forms (e.g., non-removable, random access, etc.).

In this document, the term "computer program product" is used to generally refer to removable storage unit 140 or hard disk installed in hard drive 135. These computer program products are means for providing software to digital processing system 100. CPU 110 may retrieve the software instructions, and execute the instructions to provide various features of the present disclosure described above.

The term "storage media/medium" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage memory 130. Volatile media includes dynamic memory, such as RAM 120. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 150. Transmission media can also take the form of acoustic or light waves, such as those generated during radio-wave and infra-red data communications.

As noted above, CPU 110 executes software instructions to encode one or more plain ASCII data streams. The contents/characters of the plain ASCII data stream may be stored (for example, in secondary memory 130) as an ASCII text file, and may be retrieved by CPU 110 for encoding. Alternatively, CPU 110 may receive the ASCII data stream sought to be encoded from an external network via network interface 180, or from a user via input interface 190. The encoded data may be stored on secondary memory 130 and/or transmitted via network interface 180. The software instructions executed for such encoding may constitute a user programs 126 or a utility within shared environment 125.

The manner in which CPU 110 performs the encoding of a plain ASCII data stream is described next in detail with respect to a flowchart.

3. Encoding of a Plain ASCII Data Stream

Figure 2:
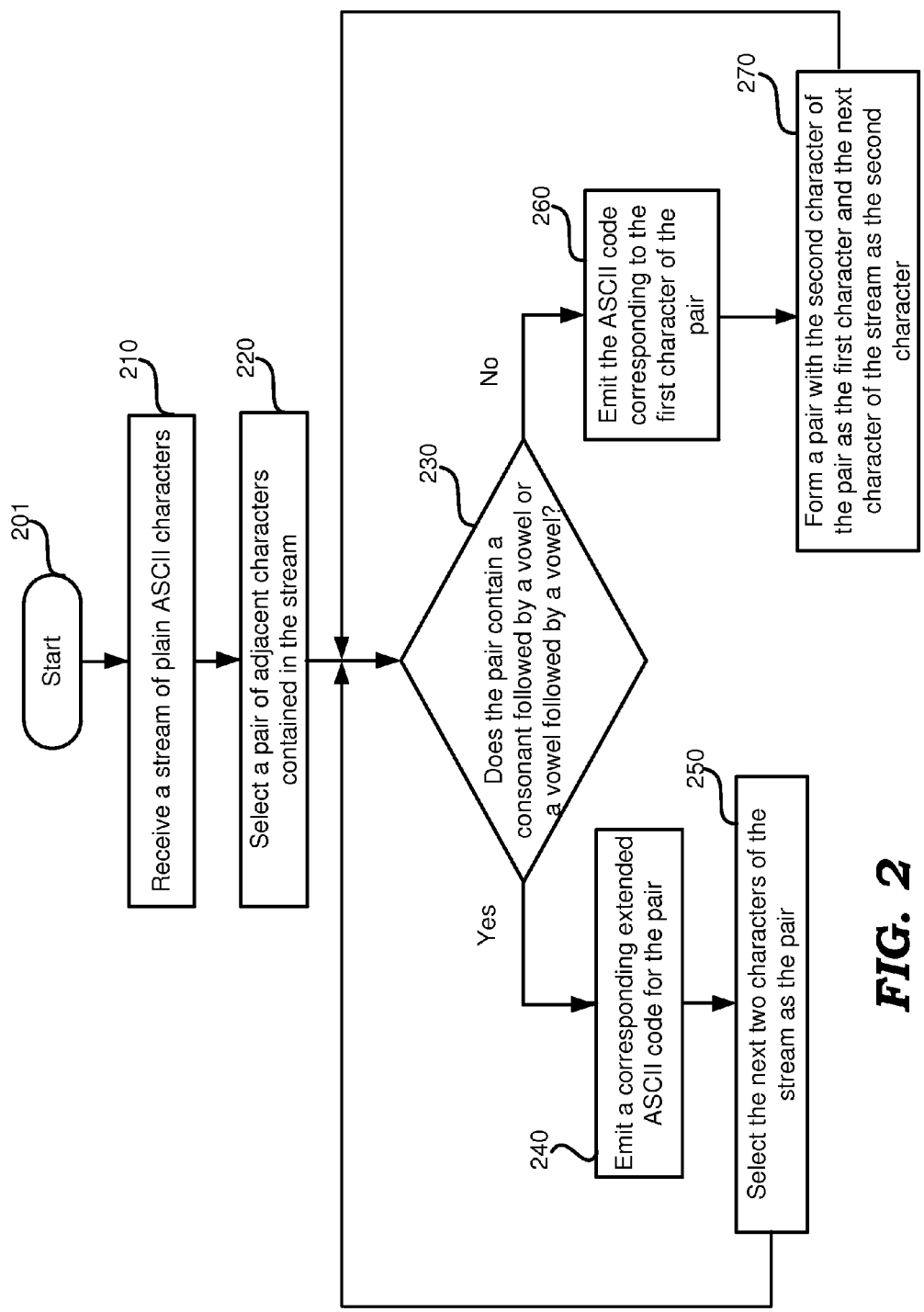
FIG. 2 is a flow chart illustrating the manner in which encoding of plain ASCII data streams is performed, according to an aspect of the present disclosure.

FIG. 2 is a flow chart illustrating the manner in which encoding of plain ASCII data streams is performed, according to an aspect of the present disclosure. The flowchart is described with respect to the blocks of FIG. 1, and with respect to CPU 110 in particular, merely for illustration. However, the features can be implemented in other systems and environments also without departing from the scope and spirit of various aspects of the present invention, as will be apparent to one skilled in the relevant arts by reading the disclosure provided herein.

In addition, some of the steps may be performed in a different sequence than that depicted below, as suited to the specific environment, as will be apparent to one skilled in the relevant arts. Many of such implementations are contemplated to be covered by several aspects of the present disclosure. The flow chart begins in step 201, in which control immediately passes to step 210.

In step 210, CPU 110 receives a stream (ordered sequence) of plain ASCII characters. As is well known in the relevant arts, the code values of plain ASCII characters lie in the range from 0 (decimal) to 127 (decimal). However, each character may be encoded as a byte (8 bits) as noted above. Control then passes to step 220. The stream may be received from a file stored on secondary memory 130, input interface 190 or from network interface 180.

In step 220, CPU 110 selects a pair of adjacent characters contained in the stream. The first two characters of the stream may be selected assuming the encoding is to be performed starting from the first character. Control then passes to step 230.

In step 230, CPU 110 determines if the pair contains a consonant followed by a vowel or a vowel followed by a vowel. As is well-known, a consonant refers to a letter of an alphabet that denotes a consonant sound. In the English alphabet, there are 21 lower case consonant letters —b, c, d, f, g, h, j, k, l, m, n, p, q, r, s, t, v, w, x, y and z, and 21 upper case consonant letters (B, C, D, F, etc.). A vowel on the other hand is a letter of the alphabet that is pronounced with an open vocal tract. In the English alphabet, there are 5 lower case vowels—a, e, i, o and u, and 5 upper case vowel letters—A, E, I, O and U. As is well known, each consonant (upper case and lower case) and vowel (upper case and lower case) has a corresponding plain ASCII code.

If CPU 110 determines that the pair contains a consonant followed by a vowel or a vowel followed by a vowel, control passes to step 240. If the pair contains neither a consonant followed by a vowel nor a vowel followed by a vowel, control passes to step 260.

In step 240, CPU 110 emits a corresponding (single) extended ASCII code for the pair. Extended ASCII codes refer to (8-bit) ASCII code values that lie in the range from 128 (decimal) to 255 (decimal). The term 'emit' refers to 'providing as an output/result of an operation'.

CPU 110 may maintain a mapping of consonant-vowel (consonant followed by a vowel) pairs and vowel-vowel (vowel followed by a vowel) pairs, and their corresponding (unique and single) extended ASCII codes in a memory store, for example, secondary memory 130. In response to the determination in step 230 that the pair contains a consonant followed by a vowel or a vowel followed by a vowel, CPU 110 may examine the mapping, and emit the extended ASCII code. Control then passes to step 250.

In step 250, CPU 110 selects the next two characters of the stream as the pair of adjacent characters. Control then passes to step 230, and the corresponding steps of the flowchart may be repeated.

In step 260, CPU 110 emits the plain ASCII code corresponding to the first character of the pair of adjacent characters. Control then passes to step 270.

In step 270, CPU 110 forms a pair with the second character of the (previous) pair as the first character and the next character of the stream as the second character. Control then passes to step 230, and the corresponding steps of the flowchart may be repeated.

While the flowchart of FIG. 2 is depicted as being an infinite loop, in practice when CPU 110 receives an indication (e.g., end-of-file/EOF) of the end of the ASCII stream, the execution of the steps of the flowchart ends. If the end is encountered while attempting step 250, the output corresponding to the stream of step 210 is deemed to have been emitted in the encoded form. On the other hand, if the end is encountered while attempting step 270, the second character processed in step 230 is emitted.

In addition, it may be observed that the approach of FIG. 2 is continued irrespective of the length of the stream, without regard to the specific patterns present in the input stream. The encoded output is the result of processing accordingly.

In an embodiment, CPU emits a corresponding extended ASCII code only if each character of the consonant-vowel or vowel-vowel character pair in the plain ASCII stream is a lower-case English-language letter, not including the letter 'z' (lower case z) in the first position of the pair. Such restriction is due to the fact that only 128 extended ASCII codes are available, and the total number of (lower-case only) consonant-vowel and vowel-vowel combinations of English language letters equals 130 (26×5—given the total of 26 alphabets/letters and 5 vowels). With 'z' in the first position ignored, only 125 (25×5) extended ASCII codes are required. However, alternative embodiments can be implemented with upper case characters (or selective choice, for different characters) being chosen for additional encoding according to features of the present disclosure.

The combinations (with vowel in the second position) are chosen based on the observation that several languages (such as Sanskrit, Hindi) are phonetic, in which the second character is a vowel in many words. English language also exhibits the use of vowels in a fairly high frequency. Accordingly at least when each character of both plain ASCII and extended ASCII is represented by a byte, compressed representation is obtained by the encoding approaches herein.

The manner in which encoding of plain ASCII data streams is performed is illustrated next with examples.

4. Example One

FIG. 3A is a diagram showing a file 300, whose plain ASCII character contents are to be encoded in the manner described above. File 300 is shown containing the sentence 'The Restaurant at the End of the Universe', with each character represented by a byte. It is assumed in the example that adjacent character pairs that are either lower case consonant-vowel (consonant followed by vowel) pairs or lower case vowel-vowel (vowel followed by vowel) pairs only (and further not including 'z' in the first position of the pair) are to be encoded by corresponding extended ASCII codes.

The table in Appendix A below shows an example mapping between lower case consonant-vowel and lower case vowel-vowel pairs and the corresponding extended ASCII code they are to be encoded as. Thus, for example, the lower case vowel-vowel pair 'aa' is to be encoded as extended ASCII code 128, the lower case consonant-vowel pair 'ba' is to be encoded as extended ASCII code 129, etc. The symbols (that appear when printed) corresponding to the extended ASCII codes are shown in column three of the table in Appendix A, and are according to ISO 8859-1 and Microsoft® Windows Latin-1 increased characters. The table shown in Appendix A may be stored in secondary memory 130.

CPU 110 receives the plain ASCII data stream represented by the sentence 'The Restaurant at the End of the Universe', and processes the stream in the manner described above with respect to the flowchart of FIG. 2. Referring to FIG. 3A, character pairs represented by markers 301, 302, 303, 304, 305, 306, 307 and 308 are either lower case consonant-vowel pairs or lower case vowel-vowel pairs. Accordingly, CPU 110 emits (step 240) the corresponding extended ASCII code shown in the table of Appendix A. For example, CPU 110 encodes the pair 'he' (indicated by marker 301) as extended ASCII code 160 (decimal), which appears as a non-breaking space character when printed, as may be observed from FIG. 3B. Similarly, CPU 110 encodes the pair 'in' (indicated by marker 306) as extended ASCII code 191 (decimal), which appears as character ¿ when printed, as also may be observed from FIG. 3B. CPU 110 operates iteratively (step 250) to identify and encode other pairs correspondingly.

When the pair of adjacent characters selected is neither a lower case consonant-vowel pair nor a lower case vowel-vowel pair, CPU 110 operates as described in steps 260 and 270 of the flowchart of FIG. 2, as may be observed from FIG. 3B. File 350 of FIG. 3B is an example output file (created by CPU 110) that stores the sentence 'T Res"u'nt at t End of t U ¿ ®r<<' after encoding of the contents of file 300 according to the flowchart of FIG. 2 and the mapping of the table of Appendix A. It may be observed that the character pairs represented by markers 301 through 308 are shown replaced by the symbol corresponding to the encoded extended ASCII code, while the other characters are retained as is.

Appendix B shows the contents of a plain ASCII text file Hitch.txt of size 1,482 bytes. Contents of file Hitch-encoded.txt, obtained by encoding file Hitch.txt according to the example described above, is listed in Appendix C, and is of size 1,273 bytes.

It may be appreciated that the substitution of a single 8-bit extended ASCII code for a pair of 8-bit plain ASCII codes results in a compressed representation of the plain ASCII data stream.

There are often situations when the space character (ASCII code—32 decimal) occurs more frequently than at least one of the vowels (e.g., character 'u'). Based on such an observation, in another embodiment of the present disclosure, character pairs with either a space or one of the four vowels (say a, e, i, and o) in the second position (following a consonant or a vowel) are selected to be encoded as extended ASCII codes. Thus, as illustrated in the following example, CPU 110 selects character pairs that are lower case consonant-space pairs, lower case consonant-one of the 4 vowels pairs, lower case vowel-space pairs or lower case vowel-one of the four vowels pairs (and again ignoring 'z' in the first position) for encoding as corresponding extended ASCII codes.

5. Example Two

FIG. 4A is a diagram showing a file 400, whose plain ASCII character contents are to be encoded. File 400 is shown containing the sentence 'The Restaurant at the End of the Universe'. The table in Appendix D below shows an example mapping between character pairs and the corresponding extended ASCII code they are to be encoded as. It is assumed in the example that lower case 'u' is to be ignored when occurring in the second position of a pair. However, in other embodiments a different vowel may be ignored when occurring in the second position of the pair. Also lower case 'z' is not considered for the mapping due to the availability of only 128 extended ASCII codes, as also noted above. The mapping of the table in Appendix D is identical to that of the table in Appendix A except for the consonant-space and vowel-space pairs (extended ASCII codes 228 to 252). The table shown in Appendix D may be stored in secondary memory 130.

CPU 110 receives the plain ASCII data stream represented by the sentence 'The Restaurant at the End of the Universe', and processes the stream in the manner described above with respect to the flowchart of FIG. 2. Referring to FIG. 4A, CPU 110 encodes character pairs represented by markers 401 through 412 as the corresponding extended ASCII code shown in the table of Appendix D. For example, CPU 110 encodes the pairs 'tSPACE' (indicated by markers 404 and 405) as extended ASCII code 247 (decimal), which appear as character '÷' when printed, as may be observed from FIG. 4B. CPU 110 operates iteratively (step 250) to identify and encode other pairs correspondingly.

When the pair of adjacent characters selected is none of a lower case consonant-vowel pair, a lower case consonant-space pair, a lower case vowel-space pair and a lower case vowel-vowel pair, CPU 110 operates as described in steps 260 and 270 of the flowchart of FIG. 2, as may be observed from FIG. 4B. File 450 of FIG. 4B is an example output file (created by CPU 110) that stores the sentence 'T Res"u'n÷a÷t Ençoét U¿ ®r<<' after encoding of the contents of file 400 according to the flowchart of FIG. 2 and the mapping of the table of Appendix D. It may be observed that file 450 has a smaller size than file 400. File 450 may be further compressed using compression utilities such as those noted above.

Thus, in general, CPU 110 examines a selected pair of adjacent characters pair for a condition that the pair contains a consonant followed by one of a set of characters, or a vowel followed by one of the set of characters. The set of characters is selected only from vowels and the space character.

In general, the choice of the type of combinations of plain ASCII characters (consonant followed by vowel, vowel followed by vowel, consonant followed by space, vowel followed by space, whether lower case or upper case, etc., to be encoded as extended ASCII codes may be determined by the number of extended ASCII codes available (which is restricted to 128) and/or considerations such as frequency of occurrence of the specific combinations, etc.

An encoded outputs according to the approaches may be further compressed using well-known techniques and/or using compression programs such as WinZip, 7-Zip, etc. (with techniques such as Huffman Coding being employed). It should be appreciated that due to operation based on input streams with different set of symbols (compared to plain ASCII) and fewer characters, a correspondingly different level of compression would be obtained, as will be apparent to a skilled practitioner.

Reference throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

Furthermore, the described features, structures, or characteristics of the disclosure may be combined in any suitable manner in one or more embodiments. In the above description, numerous specific details are provided such as examples of programming, software modules, user selections, network transactions, database queries, database structures, hardware modules, hardware circuits, hardware chips, etc., to provide a thorough understanding of embodiments of the disclosure.

6. Conclusion

While various embodiments of the present disclosure have been described above, it should be understood that they have been presented by way of example only, and not limitation. Thus, the breadth and scope of the present disclosure should not be limited by any of the above-described exemplary embodiments, but should be defined only in accordance with the following claims and their equivalents.

It should be understood that the figures and/or screen shots illustrated in the attachments highlighting the functionality and advantages of the present disclosure are presented for example purposes only. The present disclosure is sufficiently flexible and configurable, such that it may be utilized in ways other than that shown in the accompanying figures.

Further, the purpose of the following Abstract is to enable the Patent Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present disclosure in any way.

APPENDIX A

| Pair of Adjacent Characters | Extended ASCII code | Printed Symbol |
|---|---|---|
| aa | 128 | € |
| ba | 129 | |
| ca | 130 | ‚ |
| da | 131 | ƒ |
| ea | 132 | „ |
| fa | 133 | … |
| ga | 134 | † |
| ha | 135 | ‡ |
| ia | 136 | ˆ |
| ja | 137 | ‰ |
| ka | 138 | Š |
| la | 139 | ‹ |
| ma | 140 | Œ |
| na | 141 | |
| oa | 142 | Ž |
| pa | 143 | |
| qa | 144 | |
| ra | 145 | ' |
| sa | 146 | ' |
| ta | 147 | " |
| ua | 148 | " |
| va | 149 | • |
| wa | 150 | – |
| xa | 151 | — |
| ya | 152 | ˜ |
| ae | 153 | ™ |
| be | 154 | š |
| ce | 155 | › |
| de | 156 | œ |
| ee | 157 | |
| fe | 158 | ž |
| ge | 159 | Ÿ |

APPENDIX A-continued

| Pair of Adjacent Characters | Extended ASCII code | Printed Symbol |
|---|---|---|
| he | 160 | |
| ie | 161 | ¡ |
| je | 162 | ¢ |
| ke | 163 | £ |
| le | 164 | ¤ |
| me | 165 | ¥ |
| ne | 166 | ¦ |
| oe | 167 | § |
| pe | 168 | ¨ |
| qe | 169 | © |
| re | 170 | ª |
| se | 171 | « |
| te | 172 | ¬ |
| ue | 173 | |
| ve | 174 | ® |
| we | 175 | ¯ |
| xe | 176 | ° |
| ye | 177 | ± |
| ai | 178 | ² |
| bi | 179 | ³ |
| ci | 180 | ´ |
| di | 181 | µ |
| ei | 182 | ¶ |
| fi | 183 | · |
| gi | 184 | ¸ |
| hi | 185 | ¹ |
| ii | 186 | º |
| ji | 187 | » |
| ki | 188 | ¼ |
| li | 189 | ½ |
| mi | 190 | ¾ |
| ni | 191 | ¿ |
| oi | 192 | À |
| pi | 193 | Á |
| qi | 194 | Â |
| ri | 195 | Ã |
| si | 196 | Ä |
| ti | 197 | Å |
| ui | 198 | Æ |
| vi | 199 | Ç |
| wi | 200 | È |
| xi | 201 | É |
| yi | 202 | Ê |
| ao | 203 | Ë |
| bo | 204 | Ì |
| co | 205 | Í |
| do | 206 | Î |
| eo | 207 | Ï |
| fo | 208 | Ð |
| go | 209 | Ñ |
| ho | 210 | Ò |
| io | 211 | Ó |
| jo | 212 | Ô |
| ko | 213 | Õ |
| lo | 214 | Ö |
| mo | 215 | × |
| no | 216 | Ø |
| oo | 217 | Ù |
| po | 218 | Ú |
| qo | 219 | Û |
| ro | 220 | Ü |
| so | 221 | Ý |
| to | 222 | Þ |
| uo | 223 | β |
| vo | 224 | à |
| wo | 225 | á |
| xo | 226 | â |
| yo | 227 | ã |
| au | 228 | ä |
| bu | 229 | å |
| cu | 230 | æ |
| du | 231 | ç |
| eu | 232 | è |
| fu | 233 | é |
| gu | 234 | ê |
| hu | 235 | ë |
| iu | 236 | ì |
| ju | 237 | í |
| ku | 238 | î |
| lu | 239 | ï |
| mu | 240 | ð |
| nu | 241 | ñ |
| ou | 242 | ò |
| pu | 243 | ó |
| qu | 244 | ô |
| ru | 245 | õ |
| su | 246 | ö |
| tu | 247 | ÷ |
| uu | 248 | ø |
| vu | 249 | ù |
| wu | 250 | ú |
| xu | 251 | û |
| yu | 252 | ü |

APPENDIX B

Douglas Adams
The Restaurant at the End of the Universe

======================================================

Douglas Adams The Hitch Hiker's Guide to the Galaxy
Douglas Adams The Restaurant at the End of the Universe
Douglas Adams Life, the Universe, and Everything
Douglas Adams So long, and thanks for all the fish

======================================================

To Jane and James
with many thanks
to Geoffrey Perkins for achieving the Improbable
to Paddy Kingsland, Lisa Braun and Alick Hale Munro for helping him
to John Lloyd for his help with the original Milliways script
to Simon Brett for starting the whole thing off
to the Paul Simon album One Trick Pony which I played incessantly
while writing this book. Five years is far too long
And with very special thanks to Jacqui Graham for infinite
patience, kindness and food in adversity

======================================================

There is a theory which states that if ever anyone discovers
exactly what the Universe is for and why it is here, it will
instantly disappear and be replaced by something even more
bizarre and inexplicable.

======================================================

There is another theory which states that this has already
happened.

======================================================

APPENDIX C

Dòg‹s Aƒms
T Res"u'nt at t End of t U¿®r‹‹

======================================================

Dòg‹s Aƒms T Hitch Hi£r's GÆœÞ t Ga‹xy
Dòg‹s Aƒms T Res"u'nt at t End of t U¿®r‹‹
Dòg‹s Aƒms Liž, t U¿®r‹‹, and E®ryt¹ng
Dòg‹s Aƒms So Öng, and t‡nks Ðr all t ·sh

======================================================

To Ja¦ and JaÝs

ÈthŒ ny t‡nks

Þ GÏffªy Per¼ns Ðr ac¹eÇng t ImpÜ b¤
Þ Paddy Kings‹nd, Li' B'un and A½ck Ha¤ MunÜ Ðr lÅng
¹m
Þ John LÖyd Ðr ¹s lp Èth țoÃ, l Mil½-ys scÅpt
Þ Si×n B"tt Ðr s"rÅng t wÒ¤ t¹ng off
Þ t Päl Si×n alåm O¦ TÅck Pony w¹ch I p‹±d in›s'ntly
w¹¤ wÀÅng t¹s lok. Fi® ±ars is ...rÞo Öng
And Èth ®ry s̈'al t‡nks Þ Jacôi G·‡m Ðr in·¿¬

APPENDIX C-continued

Dòg<s Afms
T Res"u'nt at t End of t U¿®r<<

Åen>, ¼nd¦ss and Ðod in ad®rÄty
================================================
T $^a$ is a t ory w$^1$ch s"¬s t‡t if e®r anã¦ μsÍ®rs
e—ctly w‡t t U¿®r<< is Ðr and why is $^a$, it Èll
ins"ntly μ'p¨ar and š $^a$p<>d by Ýϒt$^1$ng e®n x$^a$
$^3$zar$^a$ and i¦xp½,b¤.
================================================
T $^a$ is aØt r t ory w$^1$ch s"¬s t‡t t$^1$s ‡s al$^a$ady
‡p¨¦d.
================================================

APPENDIX D

| Pair of Adjacent Characters | Extended ASCII code | Printed Symbol |
|---|---|---|
| aa | 128 | € |
| ba | 129 |  |
| ca | 130 | ‚ |
| da | 131 | ƒ |
| ea | 132 | „ |
| fa | 133 | … |
| ga | 134 | † |
| ha | 135 | ‡ |
| ia | 136 |  |
| ja | 137 | ‰ |
| ka | 138 | Š |
| la | 139 | ‹ |
| ma | 140 | Œ |
| na | 141 |  |
| oa | 142 | Ž |
| pa | 143 |  |
| qa | 144 |  |
| ra | 145 | ' |
| sa | 146 | ' |
| ta | 147 | " |
| ua | 148 | " |
| va | 149 | • |
| wa | 150 | – |
| xa | 151 | — |
| ya | 152 | ~ |
| ae | 153 | ™ |
| be | 154 | š |
| ce | 155 | › |
| de | 156 | œ |
| ee | 157 |  |
| fe | 158 | ž |
| ge | 159 | Ÿ |
| he | 160 |  |
| ie | 161 | ¡ |
| je | 162 | ¢ |
| ke | 163 | £ |
| le | 164 | ¤ |
| me | 165 | ¥ |
| ne | 166 | ¦ |
| oe | 167 | § |
| pe | 168 | ¨ |
| qe | 169 | © |
| re | 170 | ª |
| se | 171 | « |
| te | 172 | ¬ |
| ue | 173 |  |
| ve | 174 | ® |
| we | 175 | ¯ |
| xe | 176 | ° |
| ye | 177 | ± |
| ai | 178 | ² |
| bi | 179 | ³ |
| ci | 180 | ´ |
| di | 181 | μ |
| ei | 182 | ¶ |
| fi | 183 | · |
| gi | 184 | ¸ |

APPENDIX D-continued

| Pair of Adjacent Characters | Extended ASCII code | Printed Symbol |
|---|---|---|
| hi | 185 | ¹ |
| ii | 186 | º |
| ji | 187 | » |
| ki | 188 | ¼ |
| li | 189 | ½ |
| mi | 190 | ¾ |
| ni | 191 | ¿ |
| oi | 192 | À |
| pi | 193 | Á |
| qi | 194 | Â |
| ri | 195 | Ã |
| si | 196 | Ä |
| ti | 197 | Å |
| ui | 198 | Æ |
| vi | 199 | Ç |
| wi | 200 | È |
| xi | 201 | É |
| yi | 202 | Ê |
| ao | 203 | Ë |
| bo | 204 | Ì |
| co | 205 | Í |
| do | 206 | Î |
| eo | 207 | Ï |
| fo | 208 | Ð |
| go | 209 | Ñ |
| ho | 210 | Ò |
| io | 211 | Ó |
| jo | 212 | Ô |
| ko | 213 | Õ |
| lo | 214 | Ö |
| mo | 215 | × |
| no | 216 | Ø |
| oo | 217 | Ù |
| po | 218 | Ú |
| qo | 219 | Û |
| ro | 220 | Ü |
| so | 221 | Ý |
| to | 222 | Þ |
| uo | 223 | β |
| vo | 224 | à |
| wo | 225 | á |
| xo | 226 | â |
| yo | 227 | ã |
| aSPACE | 228 | ä |
| bSPACE | 229 | å |
| cSPACE | 230 | æ |
| dSPACE | 231 | ç |
| eSPACE | 232 | è |
| fSPACE | 233 | é |
| gSPACE | 234 | ê |
| hSPACE | 235 | ë |
| iSPACE | 236 | ì |
| jSPACE | 237 | í |
| kSPACE | 238 | î |
| lSPACE | 239 | ï |
| mSPACE | 240 | ð |
| nSPACE | 241 | ñ |
| oSPACE | 242 | ò |
| pSPACE | 243 | ó |
| qSPACE | 244 | ô |
| rSPACE | 245 | õ |
| sSPACE | 246 | ö |
| tSPACE | 247 | ÷ |
| uSPACE | 248 | ø |
| vSPACE | 249 | ù |
| wSPACE | 250 | ú |
| xSPACE | 251 | û |
| ySPACE | 252 | ü |

What is claimed is:

1. A method of encoding plain ASCII data streams, said method being performed in a digital processing system, said method comprising:

receiving a stream of characters sought to be encoded as an encoded content, with each character being represented as a corresponding plain ASCII code;

selecting a pair of adjacent characters in said stream;

examining said pair for a condition of said pair containing a consonant followed by one of a set of characters, or a vowel followed by one of said set of characters, wherein said set of characters is selected only from vowels and the space character;

if said condition is satisfied, emitting a corresponding extended ASCII code for said pair into said encoded content, and forming said pair for a next iteration as the next two characters of said stream;

if said condition is not satisfied, emitting the first character of said pair in the form of a corresponding plain ASCII code into said encoded content, and forming said pair for said next iteration with the second character of the pair as the first character and a next character of said stream of characters as the second character; and performing said next iteration of said examining and said emitting using the formed pair until all of said stream of characters are encoded in said encoded content.

2. The method of claim 1, wherein said set of characters comprises only five characters.

3. The method of claim 2, wherein said set of characters comprises only vowels in one of upper and lower cases.

4. The method of claim 2, wherein said set of characters comprises four vowels and said space character.

5. The method of claim 4, wherein said four vowels comprise a, e, i, and o.

6. The method of claim 1, further comprising processing said emitted codes by a compression approach to generate a further compressed representation of said stream of characters.

7. A digital processing system comprising:

a processor;

a random access memory (RAM);

a machine readable medium to store one or more instructions, which when retrieved into said RAM and executed by said processor causes said digital processing system to process a stream of characters sought to be encoded as an encoded content, said digital processing system performing the actions of:

receiving said stream of characters, with each character being represented as a corresponding plain ASCII code;

selecting a pair of adjacent characters in said stream;

examining said pair for a condition of said pair containing a consonant followed by one of a set of characters, or a vowel followed by one of said set of characters, wherein said set of characters is selected only from vowels and the space character;

if said condition is satisfied, emitting a corresponding extended ASCII code for said pair into said encoded content, and forming said pair for a next iteration as the next two characters of said stream;

if said condition is not satisfied, emitting the first character of said pair in the form of a corresponding plain ASCII code into said encoded content, and forming said pair for said next iteration with the second character of the pair as the first character and a next character of said stream of characters as the second character; and performing said next iteration of said examining and said emitting using the formed pair until all of said stream of characters are encoded in said encoded content.

8. The digital processing system of claim 7, wherein said set of characters comprises only five characters.

9. The digital processing system of claim 8, wherein said set of characters comprises only vowels in one of upper and lower cases.

10. The digital processing system of claim 8, wherein said set of characters comprises four vowels and said space character.

11. The digital processing system of claim 10, wherein said four vowels comprise a, e, i, and o.

12. The digital processing system of claim 7, further comprising processing said emitted codes by a compression approach to generate a further compressed representation of said stream of characters.

13. A non-transitory machine readable medium storing one or more sequences of instructions for enabling a digital processing system to process a stream of characters, wherein execution of said one or more instructions by one or more processors contained in said digital processing system enables said digital processing system to perform the actions of:

receiving said stream of characters, with each character being represented as a corresponding plain ASCII code;

selecting a pair of adjacent characters in said stream;

examining said pair for a condition of said pair containing a consonant followed by one of a set of characters, or a vowel followed by one of said set of characters, wherein said set of characters is selected only from vowels and the space character;

if said condition is satisfied, emitting a corresponding extended ASCII code in place of said pair, and forming said pair for a next iteration as the next two characters of said stream;

if said condition is not satisfied, emitting the first character of said pair in the form of a corresponding plain ASCII code, and forming said pair for said next iteration with the second character of the pair as the first character and a next character of said stream as the second character; and performing said next iteration of said examining and said emitting using the formed pair.

14. The non-transitory machine readable medium of claim 13, wherein said set of characters comprises only five characters.

15. The non-transitory machine readable medium of claim 14, wherein said set of characters comprises only vowels in one of upper and lower cases.

16. The non-transitory machine readable medium of claim 14, wherein said set of characters comprises four vowels and said space character.

17. The non-transitory machine readable medium of claim 16, wherein said four vowels comprise a, e, i, and o.

18. The non-transitory machine readable medium of claim 13, further comprising instructions for processing said emitted codes by a compression approach to generate a further compressed representation of said stream of characters.

19. A non-transitory machine readable medium storing one or more sequences of instructions for enabling a digital processing system to process streams of characters, wherein execution of said one or more instructions by one or more processors contained in said digital processing system enables said digital processing system to perform the actions of:

receiving a stream of characters sought to be encoded as an encoded content, with each character being represented as a corresponding plain ASCII code;

selecting a pair of adjacent characters in said stream;

examining said pair for a condition of said pair containing a consonant followed by one of a set of characters, or a vowel followed by one of said set of characters, wherein said set of characters is selected only from vowels and the space character;

if said condition is satisfied, emitting a corresponding extended ASCII code for said pair into said encoded content, and forming said pair for a next iteration as the next two characters of said stream;

if said condition is not satisfied, emitting the first character of said pair in the form of a corresponding plain ASCII code into said encoded content, and forming said pair for said next iteration with the second character of the pair as the first character and a next character of said stream of characters as the second character; and performing said next iteration of said examining and said emitting using the formed pair until all of said stream of characters are encoded in said encoded content.

20. The non-transitory machine readable medium of claim 19, wherein said set of characters comprises only five characters including a, e, i, and o.

* * * * *